United States Patent
Wu et al.

(10) Patent No.: US 11,183,442 B2
(45) Date of Patent: Nov. 23, 2021

(54) MANUFACTURING METHOD OF HEAT DISSIPATION COMPONENT

(71) Applicant: COMPEQ MANUFACTURING CO., LTD., Taoyuan (TW)

(72) Inventors: Sz-Shian Wu, Taoyuan (TW); Hung-Yi Lee, Taoyuan (TW)

(73) Assignee: COMPEQ MANUFACTURING CO., LTD., Taoyuan (TW)

( * ) Notice: Subject to any disclaimer, the term of this patent is extended or adjusted under 35 U.S.C. 154(b) by 58 days.

(21) Appl. No.: 16/551,742

(22) Filed: Aug. 27, 2019

(65) Prior Publication Data
US 2021/0005530 A1 Jan. 7, 2021

(30) Foreign Application Priority Data
Jul. 5, 2019 (TW) .................... 108123727

(51) Int. Cl.
| | | |
|---|---|---|
| *H01L 23/373* | (2006.01) | |
| *H05K 3/06* | (2006.01) | |
| *H05K 3/42* | (2006.01) | |
| *H05K 3/00* | (2006.01) | |
| *H01L 21/306* | (2006.01) | |
| *H05K 1/05* | (2006.01) | |
| *H05K 1/02* | (2006.01) | |

(Continued)

(52) U.S. Cl.
CPC .......... *H01L 23/373* (2013.01); *H01L 21/306* (2013.01); *H01L 23/367* (2013.01); *H05K 1/0204* (2013.01); *H05K 1/05* (2013.01); *H05K 3/0017* (2013.01); *H05K 3/06* (2013.01); *H05K 3/42* (2013.01); *H01L 21/3083* (2013.01); *H01L 21/32* (2013.01); *H05K 2203/07* (2013.01)

(58) Field of Classification Search
CPC ... H01L 23/373; H01L 21/306; H01L 23/367; H01L 21/4871; H01L 23/3733; H01L 21/32; H01L 21/3083; H05K 3/06; H05K 3/42; H05K 3/0017; H05K 1/05; H05K 1/0204; H05K 2203/07
See application file for complete search history.

(56) References Cited

U.S. PATENT DOCUMENTS

| | | | |
|---|---|---|---|
| 2004/0214023 A1 | 10/2004 | Park et al. | |
| 2015/0226493 A1* | 8/2015 | Yang | ...................... H01L 23/427 |
| | | | 165/104.26 |
| 2018/0315731 A1* | 11/2018 | Hirota | ...................... H01L 24/75 |

FOREIGN PATENT DOCUMENTS

| | | |
|---|---|---|
| CN | 104582332 | 7/2018 |
| TW | 200721927 | 6/2007 |

(Continued)

OTHER PUBLICATIONS

"Office Action of Taiwan Counterpart Application", dated Jan. 13, 2020, p.1-p. 8.

*Primary Examiner* — Patricia D Reddington
(74) *Attorney, Agent, or Firm* — JCIPRNET (57) ABSTRACT

The invention provides a manufacturing method of a heat dissipation component. A substrate is provided. The substrate has an outer surface. A patterned dry film is formed on the outer surface. The patterned dry film is composed of a plurality of microporous patterns. A thermally conductive layer is formed on a region excluding the microporous patterns on the outer surface. The patterned dry film is removed to form a plurality of micro meshes. The thermally conductive layer surrounds the micro meshes.

19 Claims, 9 Drawing Sheets

(51) Int. Cl.
*H01L 23/367* (2006.01)
*H01L 21/32* (2006.01)
*H01L 21/308* (2006.01)

(56) References Cited

FOREIGN PATENT DOCUMENTS

| | | |
|---|---|---|
| TW | 201034540 | 9/2010 |
| TW | 201812917 | 4/2018 |
| TW | I658764 | 5/2019 |

\* cited by examiner

MANUFACTURING METHOD OF HEAT DISSIPATION COMPONENT

CROSS-REFERENCE TO RELATED APPLICATION

This application claims the priority benefit of Taiwan application serial no. 108123727, filed on Jul. 5, 2019. The entirety of the above-mentioned patent application is hereby incorporated by reference herein and made a part of this specification.

BACKGROUND OF THE INVENTION

1. Field of the Invention

The invention relates to a heat dissipation component, and particularly relates to a manufacturing method of a heat dissipation component having micro meshes.

2. Description of Related Art

In recent years, to cope with the demands for being light, thin, slim, and compact on electronic products, there have been more and more demands on the respective components in the electronic products. For example, a heat dissipation component requires a plurality of micro meshes having smaller diameter (e.g., an diameter less than 25 micrometers), so as to increase the heat dissipation area and facilitate heat dissipation efficiency.

However, with the conventional methods for manufacturing micro meshes, the demand for smaller diameter is hardly met. Besides, the micro meshes formed accordingly tend to exhibit inconsistent diameters, and the upper and lower diameters of the micro meshes may also be inconsistent with each other. Therefore, how to manufacture micro meshes consistently having smaller diameter and having upper and lower diameters of the same size has become an issue to work on.

SUMMARY OF THE INVENTION

The invention provides a method of manufacturing a heat dissipation component capable of manufacturing a plurality of micro meshes having smaller and consistent diameter. In addition, the size of an upper diameter and the size of a lower diameter of each of the micro meshes are substantially the same.

The invention provides a method of manufacturing a heat dissipation component at least including the following. A substrate is provided. The substrate has an outer surface. A patterned dry film is formed on the outer surface. The patterned dry film is composed of a plurality of microporous patterns. A thermally conductive layer is formed on a region excluding the microporous patterns on the outer surface. The patterned dry film is removed to form a plurality of micro meshes. The thermally conductive layer surrounds the micro meshes.

Based on the above, in the embodiments of the invention, since the patterned dry film is composed of the microporous patterns, the micro meshes having diameters that are smaller and substantially the same as each other can be manufactured when the thermally conductive layer is formed on the region excluding the microporous patterns. In addition, the size of the upper diameter and the size of the lower diameter of each of the micro meshes are substantially the same.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 7A and FIGS. 1B to 7B are respectively partial top views and partial cross-sectional views showing a heat dissipation component according to an embodiment of the invention at different stages of a manufacturing process. In these figures, a partial top view is shown first, followed by a partial cross-sectional view taken along a line A-A' in the partial top view. For example, FIG. 1A is a partial top view showing the heat dissipation component at a stage of the manufacturing process. FIG. 1B is a partial cross-sectional view taken along the line A-A' in FIG. 1A.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Directional terms (e.g., upper, lower, right, left, front, rear, top portion, bottom portion) used herein merely serve as reference information for the accompanying drawings and shall bear no implication to the absolute directions.

Unless otherwise specified, any method/process described herein shall not be construed as requiring to carry out the steps thereof in a specific order.

The drawings of the embodiments are provided herein as reference to more comprehensively describe the invention. However, the invention may also be realized in various different forms and shall not be construed as being limited to the embodiments described herein. The thickness, dimension, or size of a layer or a region in the drawings may be enlarged for clearer illustration. Like or similar reference symbols represent like or similar components, and repeated components shall not be described repetitively.

Figure 8:
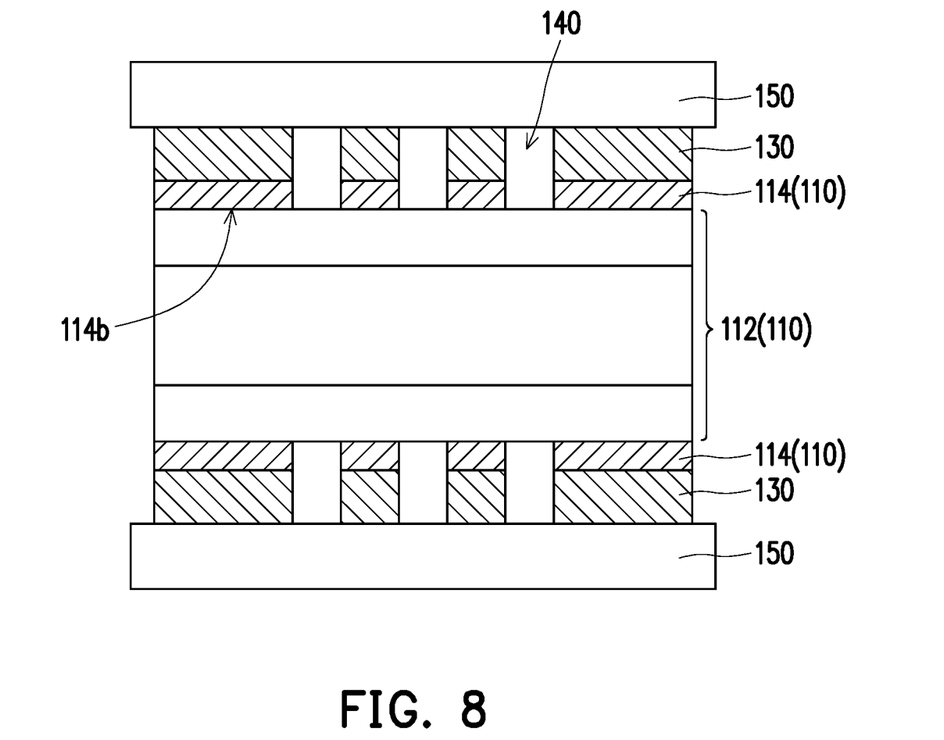
FIGS. 8 to 10 are partial cross-sectional views following FIG. 7B.
Figure 9:
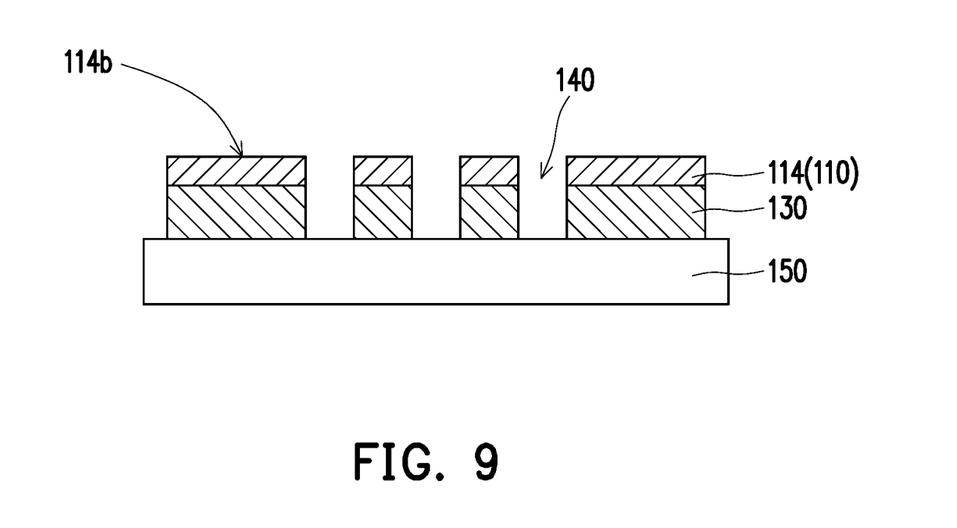
Figure 10:
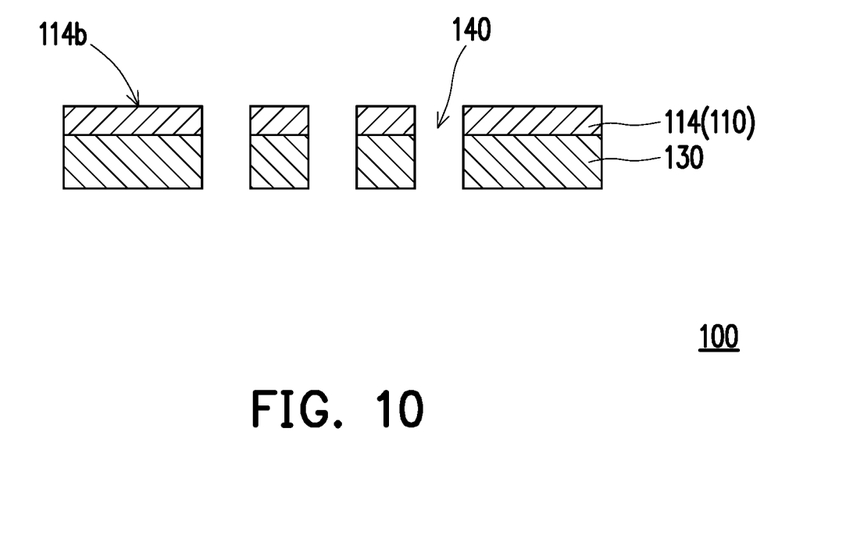

FIGS. 1A to 7A and FIGS. 1B to 7B are respectively partial top views and partial cross-sectional views showing a heat dissipation component according to an embodiment of the invention at different stages of a manufacturing process. FIGS. 8 to 10 are partial cross-sectional views following FIG. 7B.

In the embodiment, a manufacturing method of a heat dissipation component 100 may include the following steps.

Figure 1A:
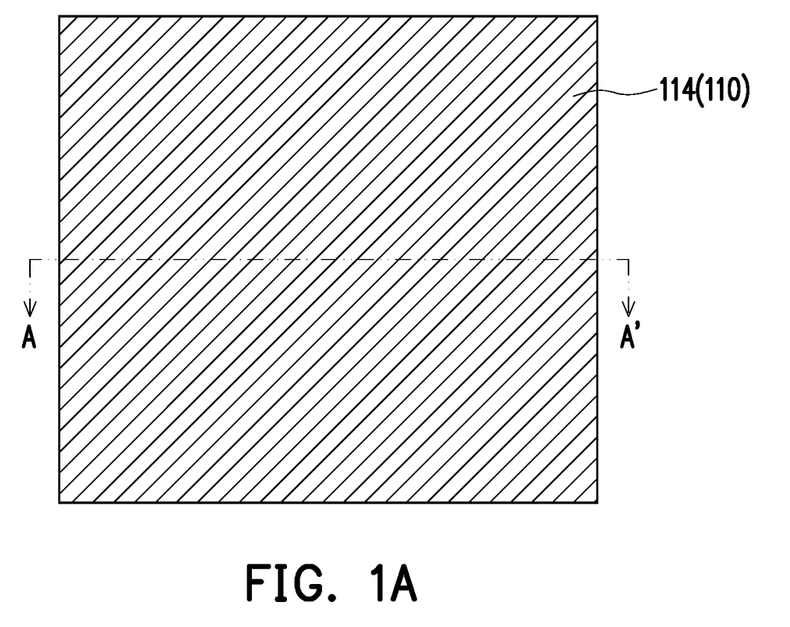
Figure 1B:
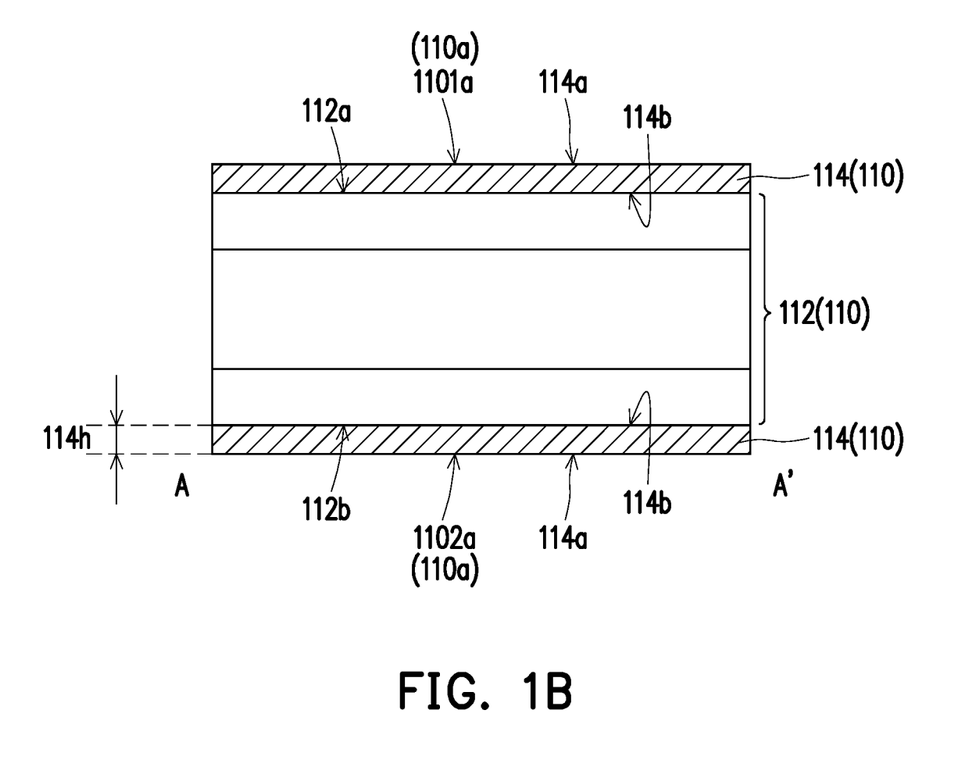

First of all, referring to FIGS. 1A and 1B, a substrate 110 is provided. The substrate 110 has outer surfaces 110a, wherein the outer surfaces 110a may include an upper surface 1101a and a lower surface 1102a.

It should be noted that a film and/or a layer described herein as being formed on the outer surface 110a is formed on the upper surface 1101a and the lower surface 1102a. However, the invention is not limited thereto. In embodiments not shown herein, a film and/or a layer described as being formed on the outer surface 110a may be formed only on the upper surface 1101a or the lower surface 1102a.

In the embodiment, the substrate 110 may include a core layer 112 and an electrically conductive layer 114, wherein the electrically conductive layer 114 is formed on the core layer 112. The core layer 112 may have a multi-layered structure. For example, the core layer 112 may be formed by alternately stacking a metal layer (the material thereof may be copper, for example), an insulating layer (the material thereof may be polypropylene, for example), and a metal layer (the material thereof may be copper, for example). However, the invention is not limited thereto. The number of layers and the arrangement of layers of the core layer 112 may be determined based on practical needs. In an embodiment, the thickness of the aforementioned metal layer may be 18 micrometers (μm), but the invention is not limited thereto.

The core layer 112 has an upper surface 112a and a lower surface 112b, wherein the electrically conductive layers 114 may be formed on the upper surface 112a and the lower surface 112b. The electrically conductive layer 114 has a first surface 114a and a second surface 114b opposite to the first surface 114a, and the first surface 114a may serve as the outer surface 110a of the substrate 110. In other words, the first surfaces 114a of the electrically conductive layers 114 form the upper surface 1101a and the lower surface 1102a of the substrate 110. The material of the electrically conductive layer 114 is copper, for example.

In an embodiment, a thickness 114h of the electrically conductive layer 114 ranges from 2 μm to 5 μm, for example. In an embodiment, the thickness 114h of the electrically conductive layer 114 is 3 μm, for example. In an embodiment, before carrying out a subsequent process, a portion of the electrically conductive layer 114 may be removed to reduce the thickness of the electrically conductive layer 114, thereby facilitating the subsequent process. For example, in the subsequent process, etching on the electrically conductive layer 114 may be performed more easily.

The method of removing the portion of the electrically conductive layer 114 includes, for example, a micro etching process. In an embodiment, the thickness 114h of the electrically conductive layer 114 is reduced from 3 μm to 2 μm, for example.

Figure 2A:
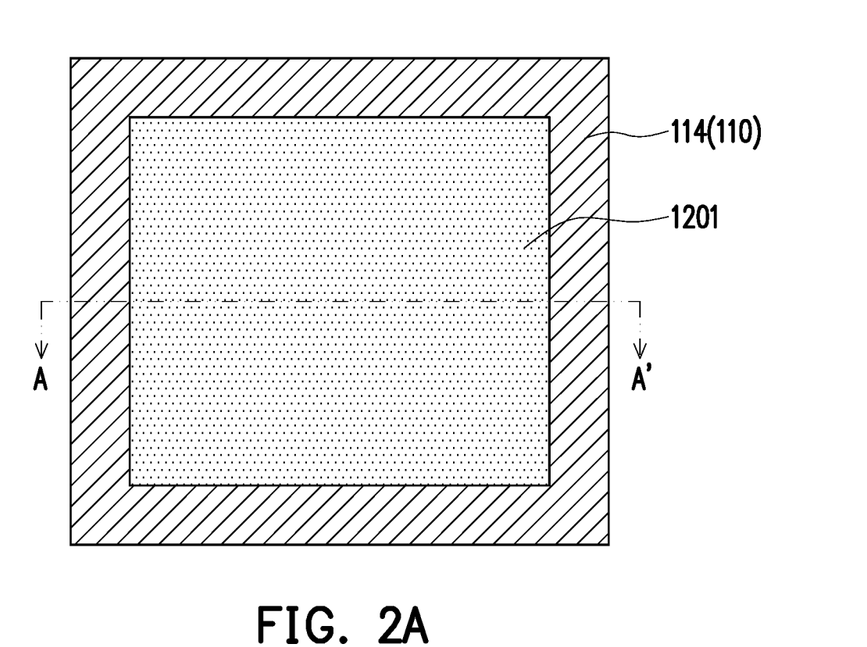
Figure 2B:
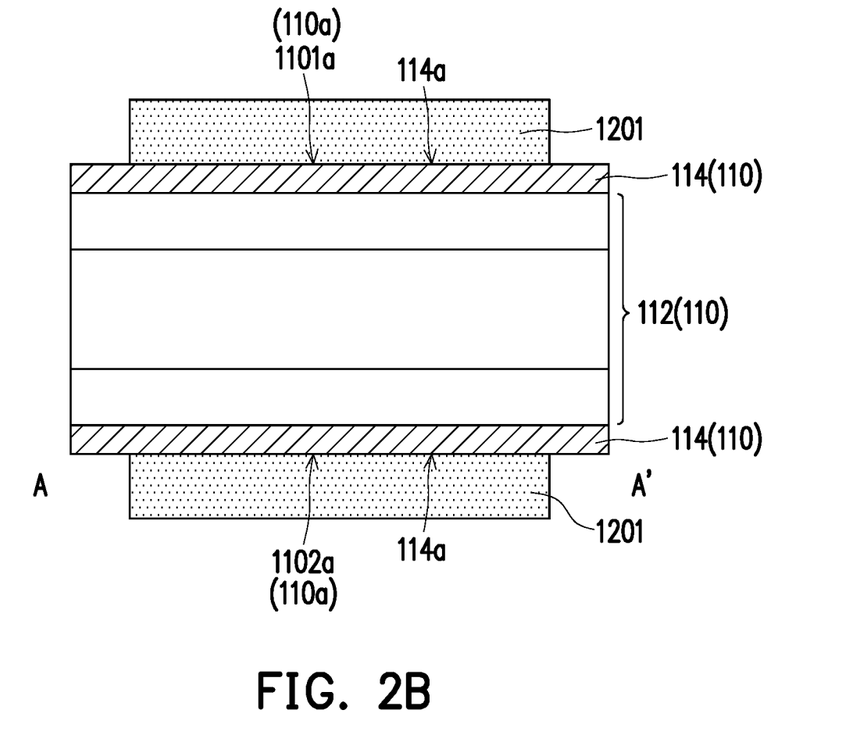

Referring to FIGS. 2A and 2B, after the substrate 110 is provided, a dry film 1201 is formed on the outer surface 110a. The dry film 1201 may cover a portion of the first surface 114a of the electrically conductive layer 114.

Figure 3A:
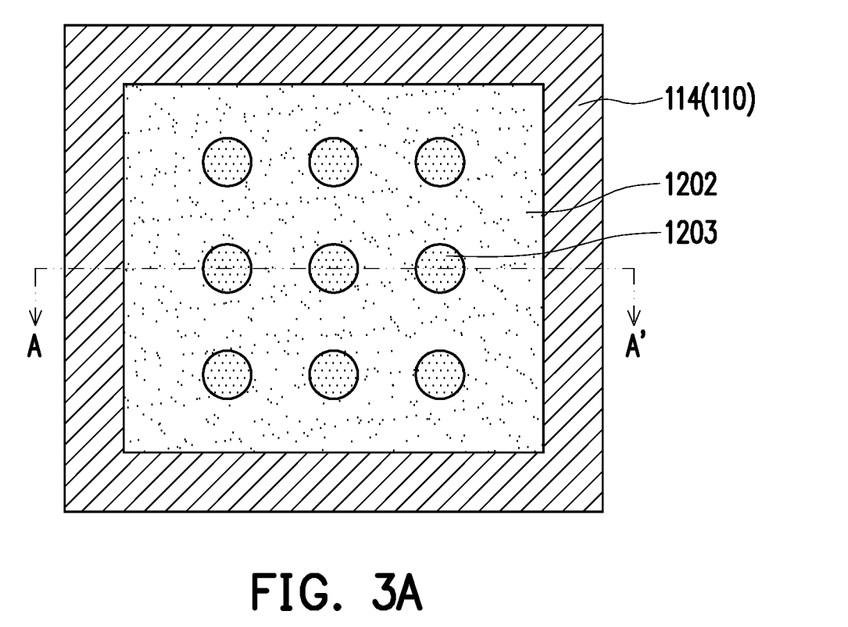
Figure 3B:
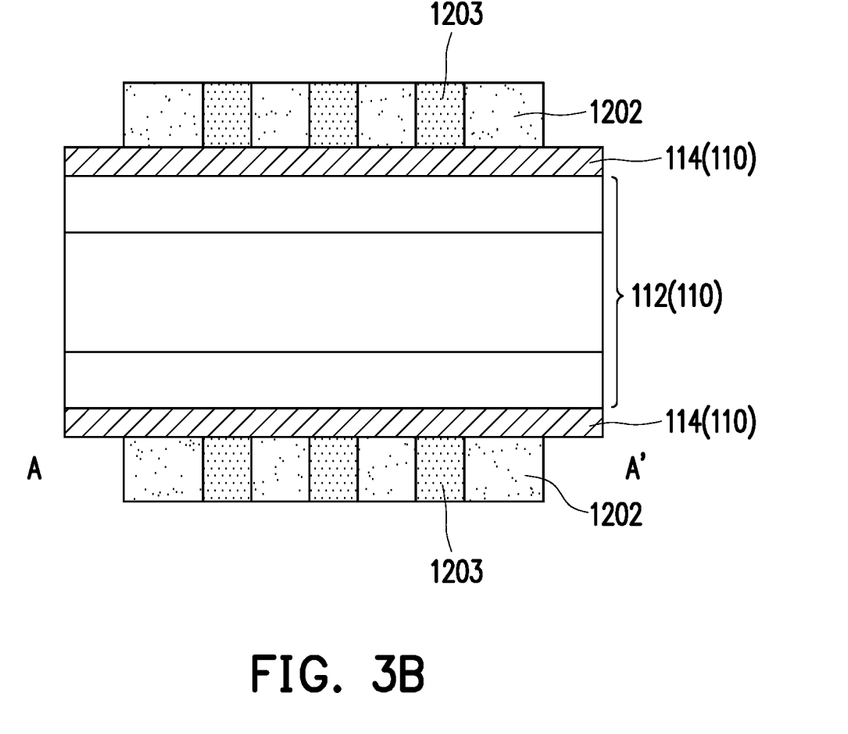

Referring to FIGS. 3A and 3B, after the dry film 1201 is formed, an exposure process is performed on the dry film 1201. The dry film 1201 has an exposed portion 1202 and a plurality of microporous patterns 1203 formed by unexposed portions.

Figure 4A:
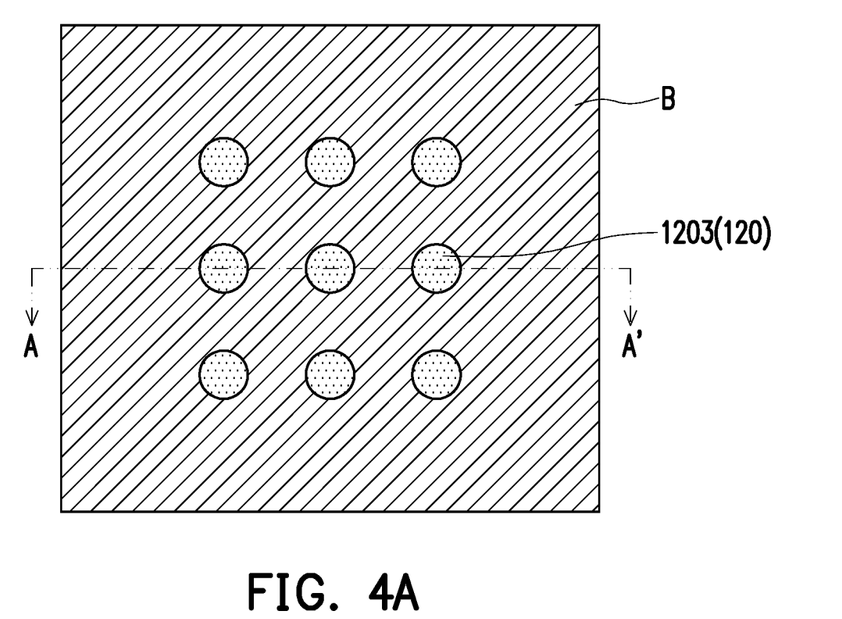
Figure 4B:
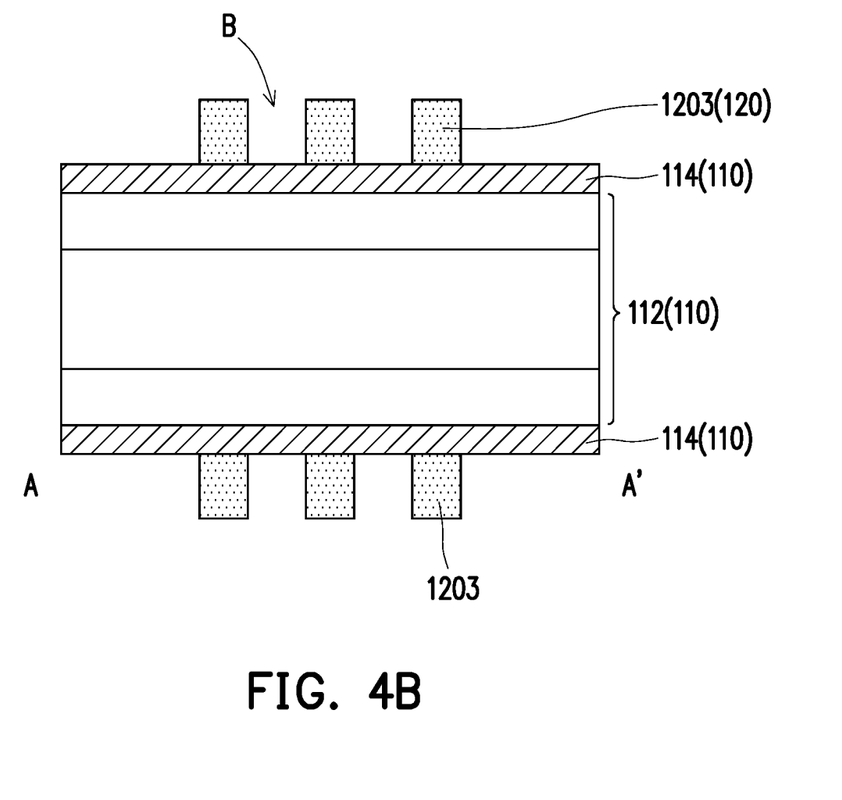

Referring to FIGS. 4A and 4B, after the exposure process is performed on the dry film 1201, a development process is performed on the dry film 1201 to form a patterned dry film 120. In the embodiment, the material of the dry film 1201 may be a positive photoresist. Therefore, the exposed portion 1202 may be removed by being dissolved by a development solution, and the microporous patterns 1203 that are not removed is composed the patterned dry film 120.

In the embodiment, the microporous patterns 1203 may expose a region B in a portion of the electrically conductive layer 114. The microporous patterns 1203 may be arranged into an array on the substrate 110.

Referring to FIGS. 4A and 4B as well as 5A and 5B, after the patterned dry film 120 is formed, a thermally conductive layer 130 is formed on the region B excluding the microporous patterns 1203 on the outer surface 110a. In an embodiment, the height of the thermally conductive layer 130 may be slightly lower than the height of the microporous patterns 1203. However, the invention is not limited thereto. The method of forming the thermally conductive layer 130 includes a plating process.

Figure 5A:
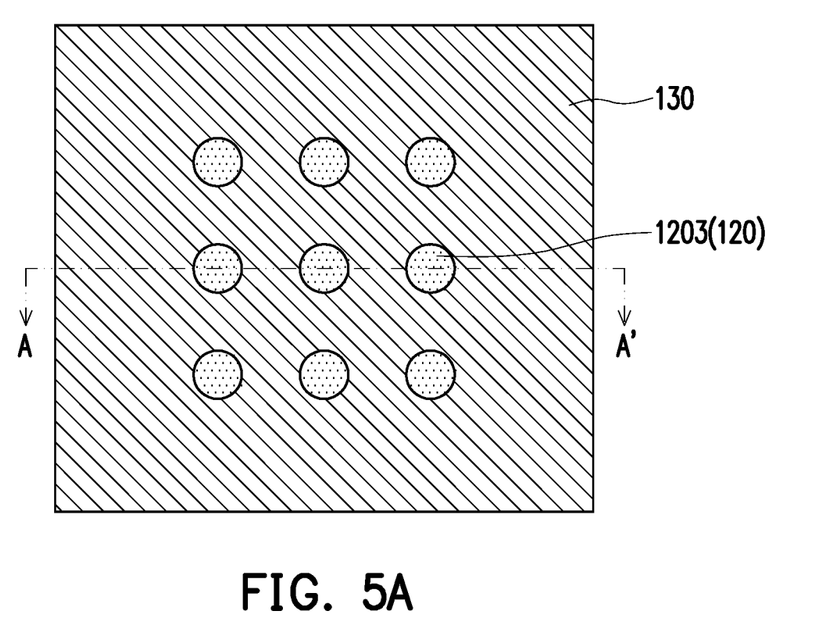
Figure 5B:
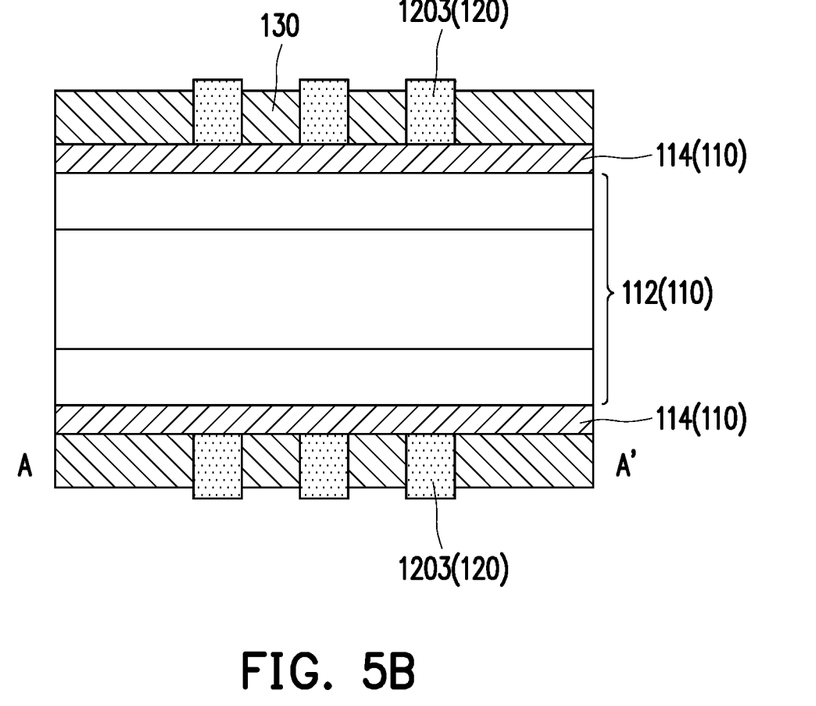

In an embodiment, the range of the thermal conductivity of the thermally conductive layer 130 may be greater than 237 Wm$^{-1}$K$^{-1}$, for example. In an embodiment, the thermal conductivity of the thermally conductive layer 130 may range from 237 Wm$^{-1}$K$^{-1}$ to 401 Wm$^{-1}$K$^{-1}$. The material of the thermally conductive layer 130 may include copper, silver, gold, aluminum. The thickness of the thermally conductive layer 130 may range from 2 μm to 25 μm, for example. However, the invention is not limited thereto. The material and the thickness of the thermally conductive layer 130 may be determined based on practical needs.

Figure 6A:
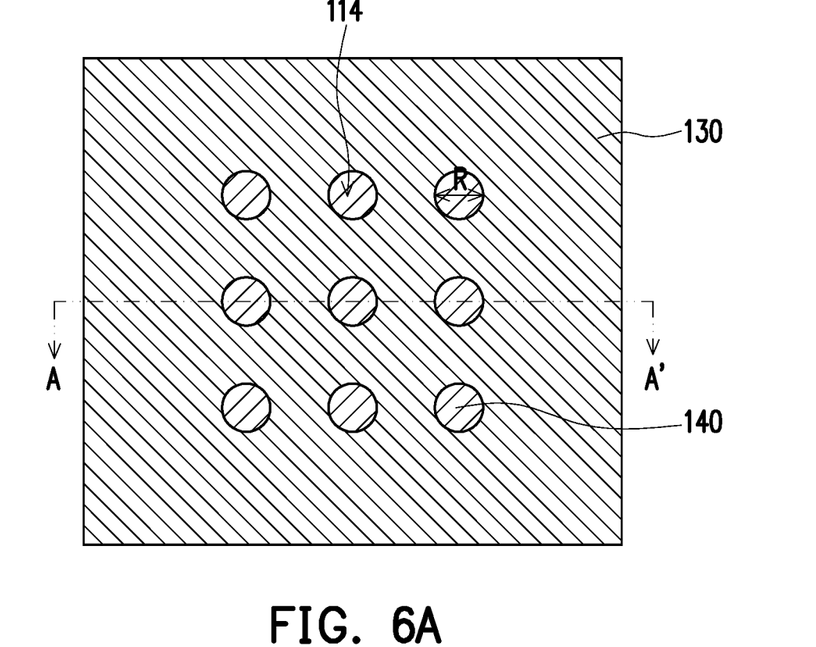
Figure 6B:
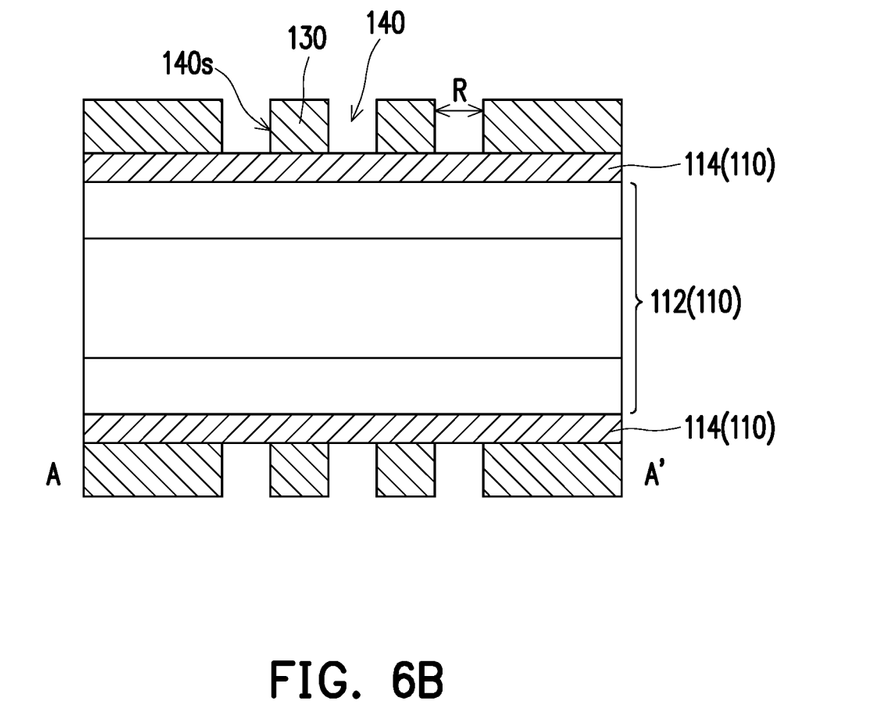

Referring to FIGS. 6A and 6B, after the thermally conductive layer 130 is formed, the patterned dry film 120 is removed to form a plurality of micro meshes 140. As shown in FIG. 6A, the thermally conductive layer 130 surrounds the micro meshes 140, and the thermally conductive layer 130 forms sidewalls 140s of the micro meshes 140. In an embodiment, the micro meshes 140 may form a mesh structure.

In the embodiment, the micro meshes 140 may have a smaller diameter R, and the diameter R of the respective micro meshes 140 are substantially the same. The diameter R of the respective micro meshes 140 may range from 17 μm to 23 μm, for example. In an embodiment, the diameter R of each of the micro meshes 140 is 20 μm, for example. It should be noted that the invention does not intend to limit the diameter R of each of the micro meshes 140, and the diameter R may be determined based on practical needs.

In the embodiment, each of the micro meshes 140 has an upper diameter away from the electrically conductive layer 114 and a lower diameter close to the electrically conductive layer 114, wherein the size of the upper diameter and the size of the lower diameter are substantially the same.

In the embodiment, since the patterned dry film 120 is composed of the microporous patterns 1203, the micro meshes 140 having the diameter R that are smaller and substantially the same as each other can be manufactured when the thermally conductive layer 130 is formed on the region B excluding the microporous patterns 1203. In addition, the size of the upper diameter and the size of the lower diameter of each of the micro meshes 140 are substantially the same.

Figure 7A:
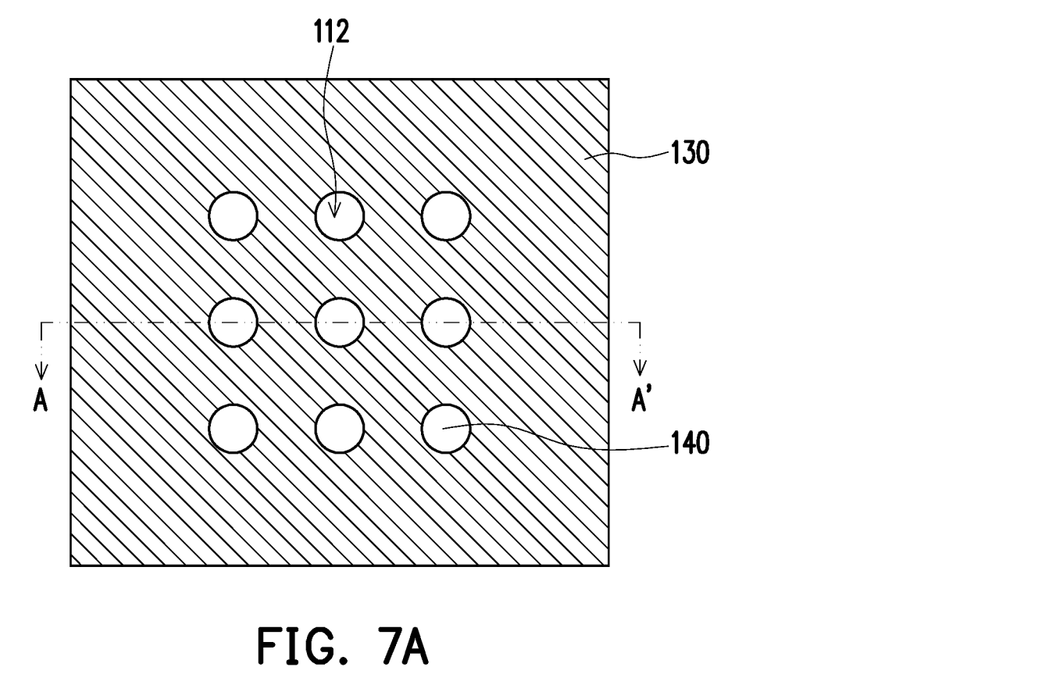
Figure 7B:
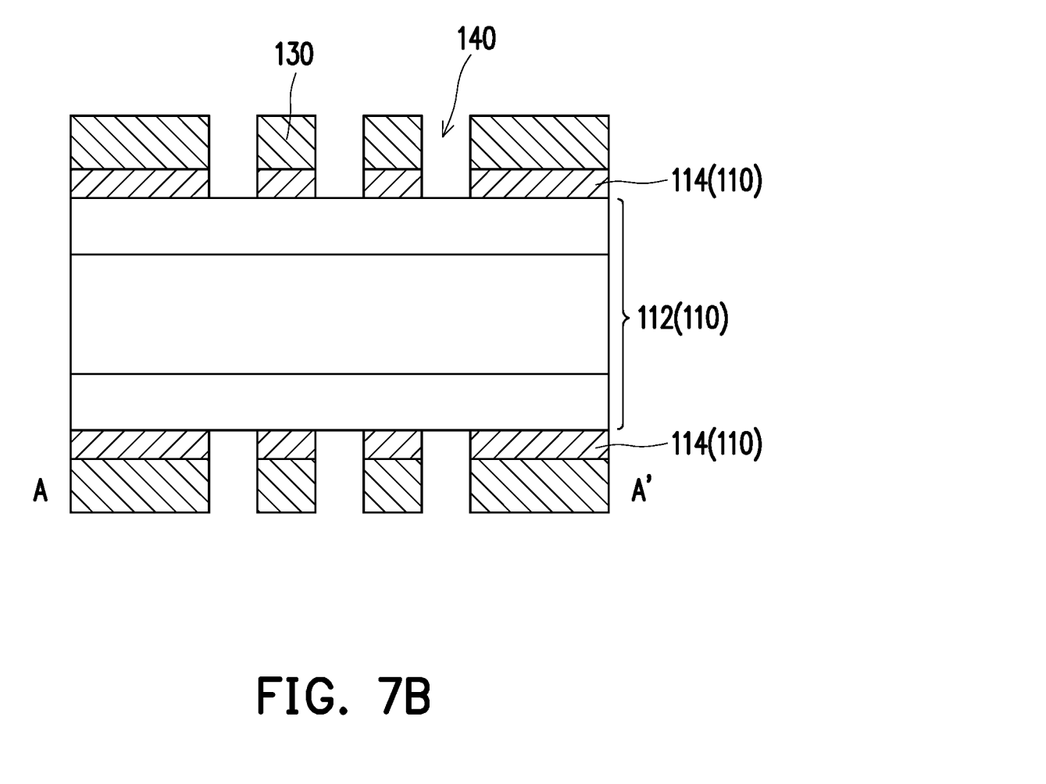

Referring to FIGS. 7A and 7B, after the micro meshes 140 are formed, the electrically conductive layer 114 exposed by the micro meshes 140 may be removed to expose the core layer 112. The method of removing the electrically conductive layer 114 exposed by the micro meshes 140 includes, for example, an etching process.

Referring to FIG. 8, after the electrically conductive layer 114 exposed by the micro meshes 140 is removed, an insulating film 150 may be formed on the substrate 110, wherein the insulating film 150 covers the thermally conductive layer 140 and the micro meshes 140. In an embodiment, the insulating film 150, the thermally conductive layer 130, and the electrically conductive layer 114 may allow the micro meshes 140 to form cavity-like structures. The material of the insulating film 150 may be, for example, polyethylene terephthalate (PET).

Referring to FIGS. 8 to 10, after the insulating film 150 is formed, the core layer 112 may be removed to expose the second surface 114b of the conductive layer 114. In an embodiment, as shown in FIG. 10, the insulating film 150 may be peeled off based on practical needs, so as to facilitate subsequent processing. After the above processes, the manufacturing of the heat dissipation component 100 of the embodiment is substantially completed.

In view of the foregoing, in the embodiments of the invention, since the patterned dry film is composed of the microporous patterns, the micro meshes having diameters that are smaller and substantially the same as each other can be manufactured when the thermally conductive layer is formed on the region excluding the microporous patterns. In addition, the size of the upper diameter and the size of the lower diameter of each of the micro meshes are substantially the same.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a heat dissipation component, comprising:
    providing a substrate having an outer surface, wherein the substrate comprises a core layer and an electrically conductive layer, the electrically conductive layer is formed on the core layer, the electrically conductive layer has a first surface and a second surface opposite to the first surface, and the first surface serves as the outer surface;
    forming a patterned dry film on the outer surface, wherein the patterned dry film is composed of a plurality of microporous patterns;
    forming a thermally conductive layer on a region excluding the microporous patterns on the outer surface; and
    removing the patterned dry film to form a plurality of micro meshes, wherein the thermally conductive layer surrounds the micro meshes.

2. The manufacturing method of the heat dissipation component as claimed in claim 1, wherein forming the patterned dry film comprises:
    forming a dry film on the outer surface;
    performing an exposure process on the dry film; and
    performing a development process on the dry film.

3. The manufacturing method of the heat dissipation component as claimed in claim 1, wherein a method of forming the thermally conductive layer comprises a plating process.

4. The manufacturing method of the heat dissipation component as claimed in claim 1, wherein a thickness of the electrically conductive layer ranges from 2 µm to 5 µm.

5. The manufacturing method of the heat dissipation component as claimed in claim 1, wherein, between providing the substrate and forming the patterned dry film, the manufacturing method further comprises:
    removing a portion of the electrically conductive layer.

6. The manufacturing method of the heat dissipation component as claimed in claim 5, wherein a method of removing the portion of the electrically conductive layer comprises a micro etching process.

7. The manufacturing method of the heat dissipation component as claimed in claim 1, wherein, after forming the micro meshes, the manufacturing method further comprises:
    removing the electrically conductive layer exposed by the micro meshes.

8. The manufacturing method of the heat dissipation component as claimed in claim 7, wherein a method of removing the electrically conductive layer exposed by the micro meshes comprises an etching process.

9. The manufacturing method of the heat dissipation component as claimed in claim 7, wherein, after removing the electrically conductive layer exposed by the micro meshes, the manufacturing method further comprises:
    forming an insulating film on the substrate, wherein the insulating film covers the thermally conductive layer and the micro meshes.

10. The manufacturing method of the heat dissipation component as claimed in claim 9, wherein, after forming the insulating film, the manufacturing method further comprises:
    removing the core layer to expose the second surface of the electrically conductive layer.

11. The manufacturing method of the heat dissipation component as claimed in claim 1, wherein diameters of the micro meshes are substantially the same.

12. The manufacturing method of the heat dissipation component as claimed in claim 11, wherein the diameter of each of the micro meshes ranges from 17 µm to 23 µm.

13. The manufacturing method of the heat dissipation component as claimed in claim 1, wherein each of the micro meshes has an upper diameter and a lower diameter, and a size of the upper diameter and a size of the lower diameter are substantially the same.

14. The manufacturing method of the heat dissipation component as claimed in claim 1, wherein a thermally conductivity of the thermally conductive layer is greater than 237Wm'K'.

15. The manufacturing method of the heat dissipation component as claimed in claim 1, wherein a material of the thermally conductive layer comprises copper, silver, gold, aluminum.

16. The manufacturing method of the heat dissipation component as claimed in claim 1, wherein a thickness of the thermally conductive layer ranges from 2 µm to 25 µm.

17. The manufacturing method of the heat dissipation component as claimed in claim 1, wherein the micro meshes form a mesh structure.

18. The manufacturing method of the heat dissipation component as claimed in claim 1, wherein the thermally conductive layer forms sidewalls of the micro meshes.

19. The manufacturing method of the heat dissipation component as claimed in claim 1, wherein the microporous patterns are arranged into an array on the substrate.

* * * * *